(12) United States Patent
Miyaharu et al.

(10) Patent No.: US 7,671,967 B2
(45) Date of Patent: Mar. 2, 2010

(54) EXPOSURE APPARATUS AND EXPOSURE METHOD

(75) Inventors: Takafumi Miyaharu, Utsunomiya (JP); Takahisa Shiozawa, Kawachi-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 284 days.

(21) Appl. No.: 11/405,472

(22) Filed: Apr. 18, 2006

(65) Prior Publication Data

US 2006/0238736 A1    Oct. 26, 2006

(30) Foreign Application Priority Data

Apr. 20, 2005   (JP) .............................. 2005-123006

(51) Int. Cl.
*G03B 27/54* (2006.01)
*G01B 11/00* (2006.01)
(52) U.S. Cl. ........................................ 355/67; 356/399
(58) Field of Classification Search .................. 355/67, 355/53, 68, 69; 250/548; 356/399, 400, 356/401
See application file for complete search history.

(56) References Cited

U.S. PATENT DOCUMENTS

| 5,121,160 | A | 6/1992 | Sano et al. ..................... 355/53 |
| 5,140,366 | A | 8/1992 | Shiozawa et al. .............. 355/53 |
| 5,345,292 | A | 9/1994 | Shiozawa et al. .............. 355/67 |
| 5,459,547 | A | 10/1995 | Shiozawa ..................... 355/67 |
| 5,475,491 | A | 12/1995 | Shiozawa ..................... 356/394 |
| 5,491,534 | A | 2/1996 | Shiozawa ..................... 355/69 |
| 5,621,499 | A | 4/1997 | Shiozawa ..................... 355/67 |
| 5,684,567 | A | 11/1997 | Shiozawa ..................... 355/67 |
| 5,699,148 | A | 12/1997 | Shiozawa ..................... 355/71 |
| 5,719,617 | A | 2/1998 | Takahashi et al. ........... 347/241 |

(Continued)

FOREIGN PATENT DOCUMENTS

EP    0 564 264 A1    10/1993

(Continued)

OTHER PUBLICATIONS

Robins G.C.; Are pattern and probe aberration monitors ready for prime time?; 2004; SPIE-Int. Soc. Opt. Eng, USA; vol. 5754; pp. 1704-1715.*

(Continued)

*Primary Examiner*—Georgia Y Epps
*Assistant Examiner*—Ryan Howard
(74) *Attorney, Agent, or Firm*—Fitzpatrick, Cella, Harper & Scinto

(57) ABSTRACT

An exposure method includes the steps of (a) calculating a pupil transmittance distribution in a projection optical system based on a first effective light source distribution of the projection optical system acquired by a measuring apparatus of an exposure apparatus, and a second effective light source distribution derived from a pupil plane light intensity distribution measured on a plate plane using light that has passed the projection optical system without a reticle, (b) calculating an imaging performance by using a result of the pupil transmittance distribution calculating step and the first or second effective light source distributions, (c) adjusting at least one of the effective light source distribution or the projection optical system by using the imaging performance, and (d) exposing the plate based on at least one of the effective light source distribution and the projection optical system that have been adjusted.

5 Claims, 6 Drawing Sheets

U.S. PATENT DOCUMENTS

| | | | |
|---|---|---|---|
| 5,726,740 A | 3/1998 | Shiozawa et al. | 355/67 |
| 5,801,815 A * | 9/1998 | Takahashi | 355/53 |
| 5,892,573 A | 4/1999 | Takahashi et al. | 355/69 |
| 6,456,377 B1 * | 9/2002 | Suzuki et al. | 356/399 |
| 6,636,295 B2 | 10/2003 | Shiozawa | 355/67 |
| 6,636,349 B2 * | 10/2003 | Takahashi et al. | 359/351 |
| 6,710,856 B2 | 3/2004 | Van Der Laan et al. | 355/71 |
| 6,757,050 B1 | 6/2004 | Shiozawa | 355/67 |
| 2002/0027648 A1 * | 3/2002 | Van Der Laan et al. | 355/71 |
| 2002/0085190 A1 * | 7/2002 | Nishi | 355/53 |
| 2004/0119973 A1 * | 6/2004 | Fukuhara et al. | 356/239.2 |
| 2006/0238736 A1 | 10/2006 | Miyaharu et al. | 355/67 |

FOREIGN PATENT DOCUMENTS

| | | |
|---|---|---|
| JP | 5-74687 | 3/1993 |
| JP | 2928277 | 5/1999 |
| JP | 2000-19012 | 1/2000 |
| JP | 2002-110540 | 4/2002 |

OTHER PUBLICATIONS

European Search Report dated Nov. 23, 2007, issued in corresponding European patent application No. EP 06 11 2610, forwarded in a Communication dated Dec. 28, 2007.

Ebihara, Takeaki, et al. "Characterization of Imaging Performance: Considering Both Illumination Intensity Profile and Lens Aberration," Proceedings of the SPIE—The International Soceity for Optical Engineering SPIE-INT., Soc. Opt. Eng. USA, vol. 5754, No. 1, 2004. pp. 1693-1703.

Extended European Search Report (including European search opinion) dated Mar. 4, 2008, mailed in a Communication dated Mar. 11, 2008, in copending European patent application No. 06 11 2610.

Ebihara, Takeaki, et al. "Characterization of Imaging Performance: Considering Both Illumination Intensity Profile and Lens Aberration," Proceedings of the SPIE—The International Soceity for Optical Engineering SPIE-INT., Soc. Opt. Eng. USA, vol. 5754, No. 1, Mar. 1-4, 2005. pp. 1693-1703.

* cited by examiner

EXPOSURE APPARATUS AND EXPOSURE METHOD

This application claims foreign priority benefit based on Japanese Patent Application No. 2005-123006, filed on Apr. 20, 2005, which is hereby incorporated by reference herein in its entirety as if fully set forth herein.

BACKGROUND OF THE INVENTION

The present invention relates generally to a measuring apparatus, and more particularly to a measuring apparatus of an incident angular distribution or a light distribution characteristic (also called "an effective light source" and "a σ distribution") on an illuminated plane. Here, a measurement of an effective light source distribution of an illumination optical system intends to cover not only a measurement of the σ distribution, but also a measurement of the centroid (or center of gravity) of illumination light.

A projection exposure apparatus, which is conventionally used for the photolithography technique to manufacture fine semiconductor devices, projects a circuit pattern of a reticle (mask) onto a wafer, and the like, via a projection optical system, thus transferring the circuit pattern.

Along with the recent demand for finer and lower profile electronic devices, finer semiconductor devices mounted on these electronic devices are increasingly demanded. A higher quality exposure requires an effective light source optimal to a reticle pattern. An effective light source distribution depends upon an adjustment of a light intensity distribution near an exit plane of, e.g., a fly-eye lens to a desired shape, such as a normal illumination shape, an annular illumination shape, and a quadrupole illumination shape. Moreover, a projection exposure apparatus is demanded to control its numerical aperture ("NA"), coherence factor σ (which is an NA of an illumination optical system/an NA of a projection optical system), and an effective light source, thus setting up a condition optimal to each of various characteristics.

Control over the coherence factor σ needs a more accurate measurement of an effective light source distribution. A measurement of a light intensity distribution on an incident pupil plane of a lens will provides the effective light source distribution. The measurement of the effective light source distribution also provides a measurement of the centroid of illumination light on the incident pupil plane, which causes an asymmetry of the imaging performance, i.e., the so-called telecentricity.

The conventional method of measuring the light intensity distribution on the pupil plane is seen, for example, in Japanese Patent No. 2,928,277, Japanese Patent Applications, Publication Nos. 2000-19012, 5-74687, and 2002-110540.

These conventional measurement methods require, in addition to a reticle, etc., a measuring apparatus, such as a mirror, a condenser optical system, a relaying optical system, an image sensor, and the like, to be arranged on a plane or planes conjugate with reticle and wafer planes. However, an accommodation of these components in an exposure apparatus would increase the cost due to its limited capacity. In addition, such measurement methods should be applicable to an immersion exposure apparatus.

BRIEF SUMMARY OF THE INVENTION

The present invention is directed to a measuring apparatus, as well as an exposure apparatus having the same, that can measure a light source distribution without an additional space.

A measuring apparatus according to one aspect of the present invention, used for an exposure apparatus that includes an illumination optical system that illuminates a reticle using light from a light source, a reticle stage that supports and drives the reticle, and a projection optical system that projects a pattern of the reticle onto a plate measures an effective light source distribution as an incident angular distribution of the light on a reticle plane of the reticle, includes a relaying optical system configured to guide the light that has passed the illumination optical system, and a housing that contains the relaying optical system and is mounted on the reticle stage in place of the reticle.

A measuring apparatus according to another aspect of the present invention, in an exposure apparatus that includes an illumination optical system that illuminates a reticle by using a light from a light source, and a projection optical system that projects a pattern of the reticle onto a plate, measures an effective light source distribution as an incident angular distribution on a reticle plane of the light, and includes a pinhole member configured to transmit the light that has passed the illumination optical system into a pinhole with a diameter determined by a blur of a geometrical optics and wave optics, and a deflector configured to deflect the light that has passed through the pinhole.

An exposure apparatus having the above measuring apparatus constitutes still another aspect of the present invention.

An exposure method according to another aspect of the present invention includes the steps of calculating a pupil transmittance distribution in a projection optical system based on a first effective light source distribution of the projection optical system acquired by the above measuring apparatus, and a second effective light source distribution derived from a pupil plane light intensity distribution measured on a plate plane using light that has passed the projection optical system without a reticle, calculating an imaging performance by using a result of the calculating step and the first or second effective light source distributions, adjusting the effective light source distribution and/or the projection optical system by using the imaging performance, and exposing the plate based on the effective light source distribution and/or the projection optical system that have been adjusted.

A device manufacturing method including the steps of exposing a plate using the above exposure apparatus, and developing the plate exposed constitute other aspects of the present invention.

Other objects and further features of the present invention will become readily apparent from the following description of the preferred embodiments with reference to the accompanying drawings.

DETAILED DESCRIPTION OF THE PREFERRED EMBODIMENTS

Referring to the accompanying drawings, a description will now be given of exposure apparatuses according to various embodiments of the present invention. These exposure apparatuses are step-and-scan projection exposure apparatuses, but they are also applicable to a step-and-repeat type and other types.

First Embodiment

Figure 1:
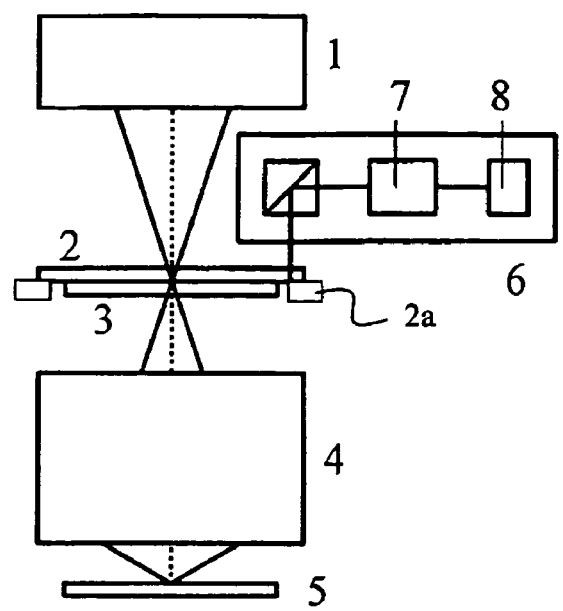
FIG. 1 is a schematic sectional view of an exposure apparatus according to one aspect of the present invention.

FIG. 1 is a schematic sectional diagram of an exposure apparatus according to a first embodiment. In FIG. 1, reference numeral 1 denotes an illumination optical system. A light from a laser is relayed by the illumination optical system 1, entering the reticle plane with a desirable light intensity distribution. A pellicle 3 is provided under a reticle 2 and prevents particles from adhering to a reticle plane. The reticle 2 is mounted on and driven by a reticle stage 2a.

A light that has passed the reticle 2 goes through a reduction projection optical system 4, and is imaged onto a wafer 5. In order to adjust the positioning and focusing of the reticle 2, a device (alignment scope) 6 observes a mark formed on the reticle plane. The reticle plane observing device 6 includes an optical system 7 and an image sensor 8. The optical system 7 has an objective lens, a relay lens, and a magnification-variable erector lens, and the image sensor 8 uses a two-dimensional charge-coupled device (CCD).

Figure 2:
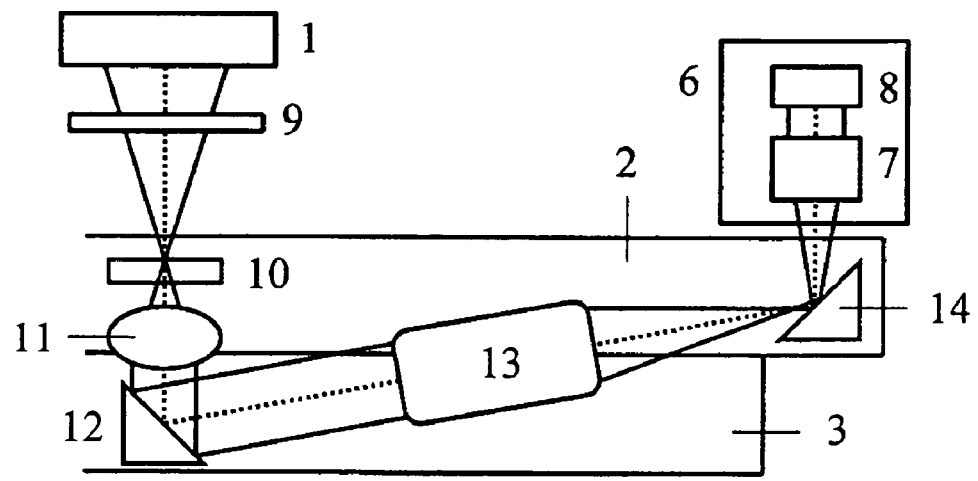
FIG. 2 is a transverse sectional view of a tool for measuring a light intensity distribution, applicable to a first embodiment of the present invention.

The first embodiment measures an effective light source distribution using this configuration. In place of a usual reticle, a tool conjugate with the size of the reticle 2 and pellicle 3 is transported. The tool is located in a space from where the reticle 2 and the pellicle 3 are removed, thus needing no additional spaces. FIG. 2 is a partially enlarged transverse sectional view of the tool, and it can be understood that the optical system is stored in a housing conjugate with the reticle 2 and the pellicle 3 in size. The housing is mounted on and driven by the reticle stage.

This embodiment includes a collimator lens 11, explained later, configured to collimate the light and a deflector 12 configured to bend the light, and reduces a thickness of the housing within the size of the reticle 2 and the pellicle 3. The tool uses a driving mechanism for the reticle stage 2a and the alignment scope 6, and requires no dedicated driving mechanism.

The light relayed from the light source by the illumination optical system 1 narrows down to a necessary area through a masking blade 9 that restricts the illumination area on the reticle plane, and enters a pinhole 10. The pinhole 10 may be slightly defocused from a plane conjugate with the reticle plane for spatial convenience. The collimator lens 11 substantially collimates the light that has passed through the pinhole 10. By using the deflector 12, such as a mirror or prism, the illumination light having been turned into collimated light enters a Fourier transforming optical system 13. An aerial pupil image is formed by the Fourier transforming optical system 13 at a position conjugate with the observation plane of the reticle plane observing element 6, and it is imaged at an approximately conjugate image sensor 8, thus measuring a light amount distribution through image processing. Based on this light amount and an observation diameter in the image sensor 8, a coordinate is calculated for a conversion into an effective light source distribution of an illumination optical system. The first embodiment observes an image using the image sensor 8, and the position of the pinhole 10 and the observation position of the image sensor 8 may be in an imaging relationship.

Stopping down the illumination light by the masking blade 9 reduces the influence by the stray light (unnecessary light). An aperture of the masking blade 9 should not be so small as to shut out the light incident upon the pinhole 10, and it should be, desirably, set to be as small as possible. The pinhole 10 is formed on a Cr surface through etching. Desirably, the size and density of the Cr surface should be so large that stray light does not leak from illumination light stopped down by the masking blade 9. For control over the largely remaining Cr surface transmission, a mechanical light shield is provided with a sheet metal tiger-den material with holes around the pinhole 10.

Figure 3:
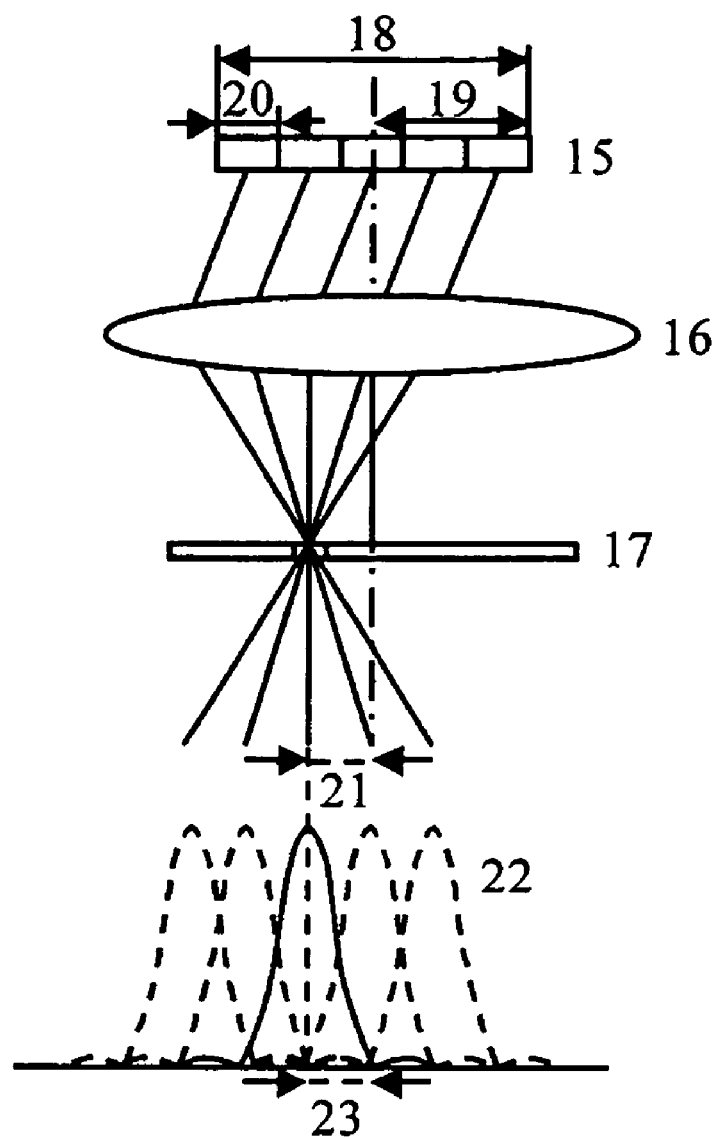
FIG. 3 is a schematic view showing setting conditions for the diameter of a pinhole shown FIG. 2.

It is desirable that the diameter of the pinhole 10 be large so as to measure a light intensity distribution with sufficient resolving power. As a factor for determining the resolving power, a blur of the distribution and the resolving power of the image sensor can be considered. Here, using FIG. 3, an explanation is given of a blur of a distribution. FIG. 3 briefly shows an optical system for the illumination light that is condensed by a condenser lens 16 from a fly-eye lens 15 to a pinhole 17 in a plane conjugate with the reticle plane in the illumination optical system. FIG. 3 shows a light that exits from the fly-eye lens 15 with a certain angle. The illumination light that passes the fly-eye lens 15 has a discrete angular distribution characteristic at one point on the reticle plane. This angular distribution characteristic depends upon the configuration of the fly-eye 15. The following equation is met where L is an external diameter 18 of the fly-eye lens 15, S is an outer diameter 20 of each fine lens comprising the fly-eye lens 15, IllNA is an NA of an illumination system conjugate with half of the outer diameter L, and P is an NA of an interval 21 of illumination light at the reticle plane:

$$P = 2 \times IllNA \times S/L. \quad (1)$$

The illumination light that has passed the pinhole 17 with a discrete angular distribution characteristic has a divergent angle due to diffraction, i.e., an airy disk 22. The following equation is met with a wavelength $\lambda$ and a diameter $\phi$ of a pinhole, where A is a divergence angle 23 that corresponds to a first zero-point radius of this airy disk 22:

$$A = 3.83 \times \lambda / \phi / \pi. \quad (2)$$

Since respective light beams that have passed through the fly-eye lens 15 are each affected by the diffraction, use of a pinhole diameter satisfying the following formula enables a light from each fly-eye lens to be wave-optically separated and measured:

$$P > 2 \times A. \quad (3)$$

When using a lens system for measuring an effective light source distribution, a blur due to an aberration needs to be considered. Assume that the observation range radius of the image sensor 8, corresponding to the illumination system's NA 19 is H, and an RMS spot diameter due to an aberration is D. D can geometrically-optically separate each light when satisfying the following formula:

$$D < 2 \times H \times S/L. \quad (4)$$

Besides these items, it is desirable to consider the dose incident on the image sensor, and the resolving power of the image sensor.

These formulas define a pinhole diameter with a desired resolving power. An objective of setting a pinhole diameter is to separate light from a fly-eye lens for measurement, or to specify an amount of blurring at the beginning, so as to set a pinhole diameter. In view of a dynamic range of the image sensor 8, light from the fly-eye lens may not be separated. The first embodiment sets the diameter of the pinhole 10 to φ50 μm. In order to control blurring caused by an aberration of a lens system, a tolerance for distortion of a lens system is relaxed, and the distortion is corrected by using image processing software.

The above pinhole diameter determination method can be applied across all the pupil plane light intensity distribution measurements for an exposure apparatus using a pinhole.

The illumination light on a reticle plane contemplates a maximum NA of 0.25 to 0.35 for an immersion exposure apparatus, although depending on an illumination condition. In order to keep the tool within the size of the reticle and pellicle, it is necessary to control a spread of the effective diameter of the illumination light that has passed the pinhole 10. For this purpose, the first embodiment has prepared a collimator lens 11 that collimates the illumination light that has passed through the pinhole 10. Besides using a collimator lens, it is possible to use a deflector having a curvature.

Figure 4:
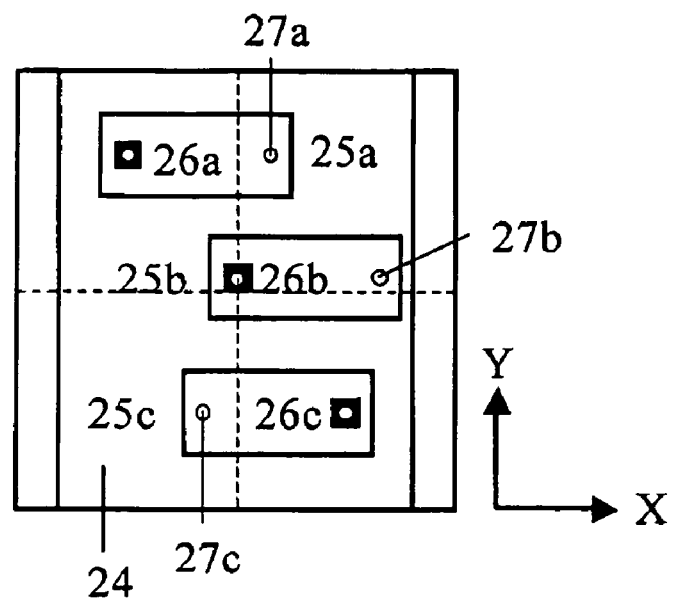
FIG. 4 is a plan view of the tool shown in FIG. 2.

FIG. 4 is a plan view when the tool for measuring the effective light source distribution is viewed from the laser incident side. Although this embodiment uses two reticle plane observation systems, only one may be used. An area 24 is a size of a plane conjugate with the reticle plane. An optical system 25*b* shows a profile of the tool shown in FIG. 2, which measures the on-axis effective light source distribution of the illumination system. Optical systems 25*a* and 25*c* measure the illumination system's off-axis effective light source distribution. The optical system 25 includes a pinhole 26 for the illumination light and a light exit position 27 that introduces the illumination light into the reticle plane observing device 6.

In this embodiment, the reticle stage supports the reticle and moves in a y direction or a scanning direction in FIG. 4. The reticle plane observing device 6 moves in an x direction. Since the pinhole 10 and the optical system 25 are housed within the tool, the two-dimensional movements guide the tool to a measuring position.

A method of moving the tool to a measuring position may be a scanning search for a light source, or may use an alignment mark. The scanning search for the light source takes time before measuring. On the other hand, the alignment mark has a high reproducibility, and enables a light intensity distribution to be measured by a designated coordinate.

The optical system 25 can move in the X direction, and provides measurement of an effective light source distribution of an illuminating system with a required image height. If each optical system 25 uses the same optical system, they are viable even if rotated by 180°. This configuration calibrates the optical system 7 of the reticle plane observing device 6 and the optical system 25 of the tool.

The first embodiment almost maintains telecentric an aerial pupil image of the Fourier transforming optical system 13. The collimated light at the observation position of the reticle plane observing device 6 controls a size measurement error caused by a defocus. A known aperture stop, and the like, calculates an absolute value of a σ distribution observable by the image sensor 8 and the central position of the image sensor 8, and corrects an aberration of an optical system, such as a distortion.

The reticle plane observing device 6 can defocus the observation position. Defocusing the observation position, measuring two or more pupil plane illumination distributions, and finding its centroid shift can measure the inclination of illumination light. This result represents an inclination of the illumination light on the reticle plane, and the so-called telecentricity is obtained by subtracting telecentricity of the projection optical system from it. Of course, when a reference position of the image sensor is previously measured for each image height, measurement at only the best focus position provides the inclination of the illumination light.

When the tool or reticle plane observing device 6 houses a beam splitter and analyzer, and they are switched, an effective light source distribution can be measured for each polarized light at the time of polarization illumination.

The configuration of the present embodiment can provide a measurement of an effective light source distribution of an illumination system corresponding to a scan σ. In a step-and-scan exposure apparatus, the light intensity distribution at each position imaged on a wafer will become a scanning accumulation with the entire illumination slit. A scanning effective light source distribution is different from a stationary effective light source distribution. It is important to measure an actual effective light source distribution corresponding to the scan σ.

A scanning effective light source distribution can be measured with a slit that elongates in the scanning direction instead of a pinhole. An accumulation of obtained light intensity distributions in the scanning direction provides an actual scanning effective light source distribution. Use of a slit that is longer in the scanning direction than the illuminated area may provide a scanning effective light source distribution through only one measurement.

The effective light source distribution of an illumination optical system measured in this embodiment can be utilized to adjust and to correct the illumination optical system. Since measurement results are outputted from the reticle plane observing device 6, its calibration with the exposure apparatus body is easy. The transmittance of the projection optical system can be obtained when an effective light source distribution on a wafer plane is compared with an effective light source distribution on a reticle plane of this embodiment.

Second Embodiment

Next follows a second embodiment that uses an effective light source distribution measuring tool, which also includes an image sensor according to the present invention, to measure an effective light source distribution of an illumination system. The second embodiment is different from the first embodiment in that the tool also includes the image sensor, and measures an effective light source distribution without using the reticle plane observing device 6.

Figure 5:
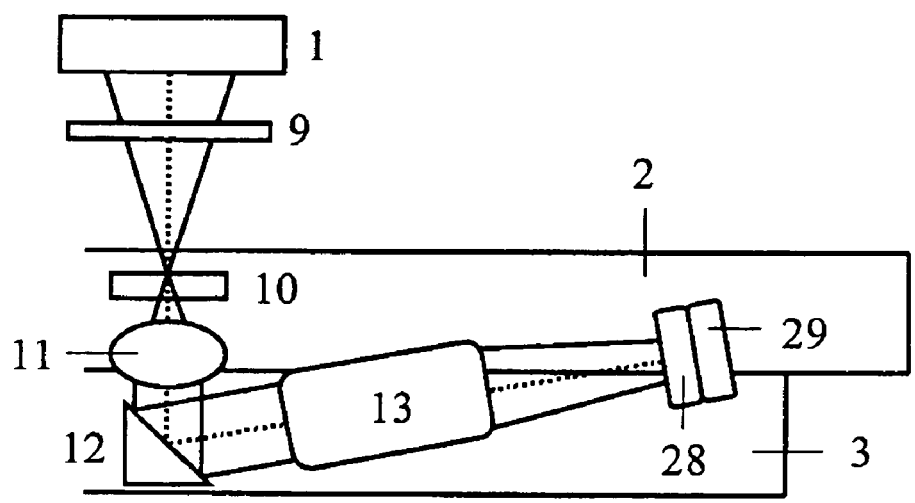
FIG. 5 is a transverse sectional view of a tool for measuring a light intensity distribution, applicable to a second embodiment of the present invention.

This embodiment transports a tool that is as large as the reticle 2 and pellicle 3 in place of the ordinary reticle, and has a pinhole, an optical system, and an image sensor. FIG. 5 shows a transverse sectional view of the tool. A light relayed from a light source by an illumination optical system 1 narrows down to a necessary area through the masking blade 9 that limits the illumination area on a reticle plane, and enters the pinhole 10. The light that has passed through the pinhole 10 becomes almost collimated light via the collimator lens 11. The collimated illumination light is incident on the Fourier transforming optical system 13 through the deflector 12, such as a mirror and prism. A light source image is formed by the Fourier transforming optical system that is equivalent with a light intensity distribution on an exit pupil plane of the optical system, and an effective light source distribution is measured by the image sensor 28.

This embodiment uses a wireless communication as a data communication means. Data acquired by the image sensor 28 is sent directly to the apparatus body using a wireless communication unit 29.

Third Embodiment

Figure 6:
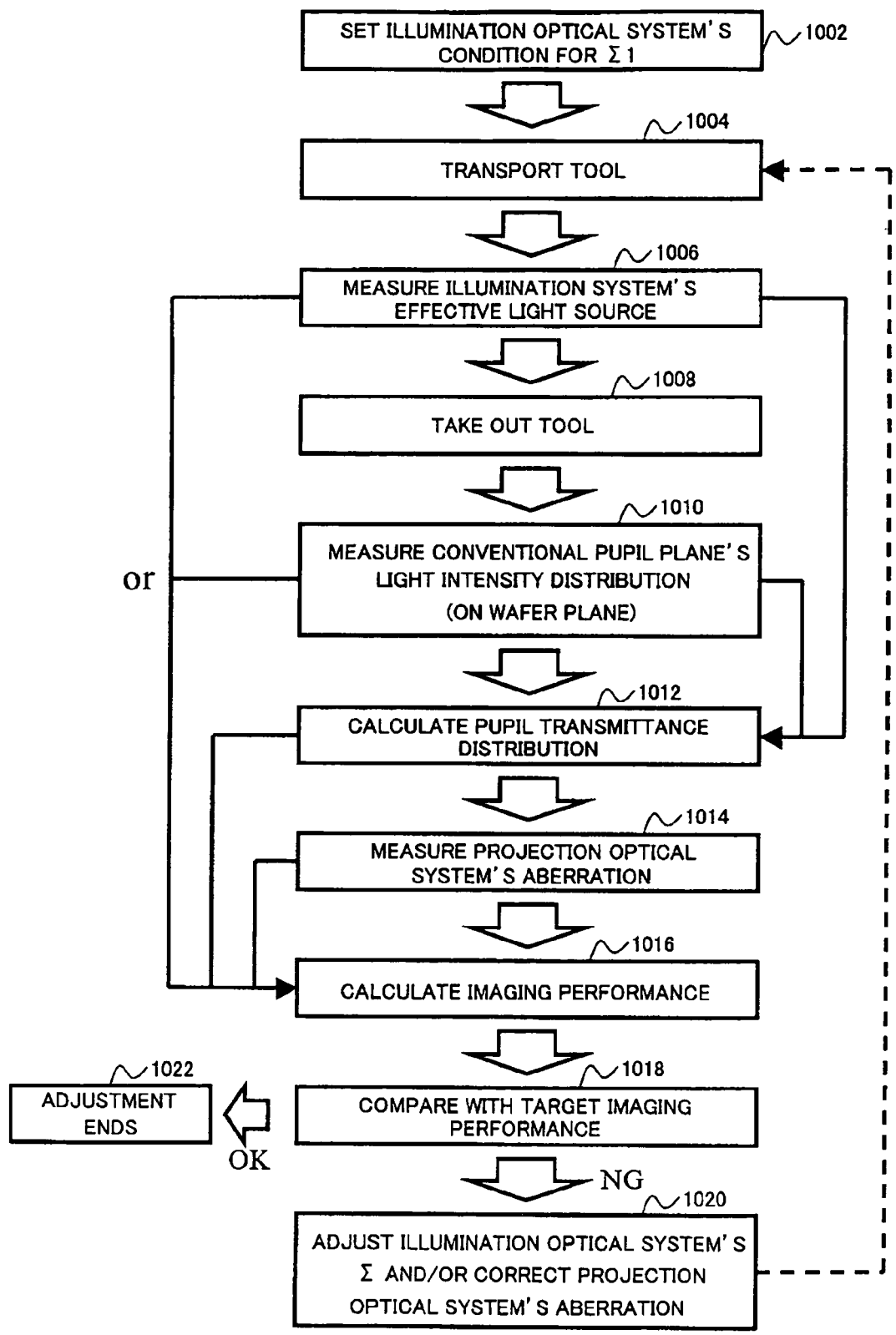
FIG. 6 is a flowchart for a σ adjustment and aberration correction method in a third embodiment of the present invention.

A third embodiment of the present invention uses the effective light source distribution obtained in the first and second embodiments to adjust an illumination system and to evaluate the imaging performance. FIG. 6 shows a flowchart of this method. Initially, an illumination condition for optimization is determined. In order to define the size of σ=1, an illumination optical system's condition is set for σ=1 (Step 1002). Next follows a transportation of the above tool (Step 1004). Then, an effective light source distribution is set for the illumination system (Step 1006). Then, the tool is taken out (Step 1008).

Next, the light intensity distribution on the pupil plane is measured while the reticle 2 and the pellicle 3 are removed (Step 1010). For an immersion exposure apparatus, step 1010 provides two wafer stages—one for exposure and one for measurement. Thus, the stage for measurement can be driven for measurements during exposure, and the throughput improves. In addition, the wafer stage for exposure is for immersion in this embodiment, but the stage for measurement is not provided for immersion. Therefore, even if a pinhole that is formed by etching glass with Cr is used, no problems occur about the concentration and durability of Cr against the immersion liquid.

The transmittance distribution of the pupil in the projection optical system 4 is calculated from the results of steps 1006 and 1010 (Step 1012). In addition, an aberration of the projection optical system is measured in the exposure apparatus simultaneously (Step 1014).

The imaging performance is calculated based on the effective light source distribution, is calculated on the reticle plane or the wafer plane, the transmittance distribution of the pupil of the projection optical system, the aberration of the projection optical system, the NA of the projection optical system, the reticle pattern to be used, and the wavelength to be used (Step 1016). This imaging performance is compared with a target imaging performance (Step 1018), and if out of the permissible range, at least one of the effective light source distribution, the aberration of the projection optical system, and its NA are adjusted (Step 1020). The comparing items with the target imaging performance include the critical dimension ("CD") uniformity and the HV difference, OPE calculation, etc. The second and subsequent adjustments direct to the target values by calculating sensitivity. When the current imaging performance is a permissible range from the target imaging performance, the adjustment ends (Step 1022). An automatic series of adjustments are preferable. The transmittance and aberration of the pupil of the projection optical system need not be measured in the exposure apparatus body. However, they may be measured when the exposure apparatus is assembled, and the data may be used for calculation.

This embodiment can quickly adjust the effective light source distribution of an illumination system and aberration of a projection optical system. This optimization, which is not for each unit, such as an illumination system or a projection system, but for a whole exposure apparatus that is installed with an illumination system and projection system, is suitable for actual exposure of a wafer.

Fourth Embodiment

Figure 7:
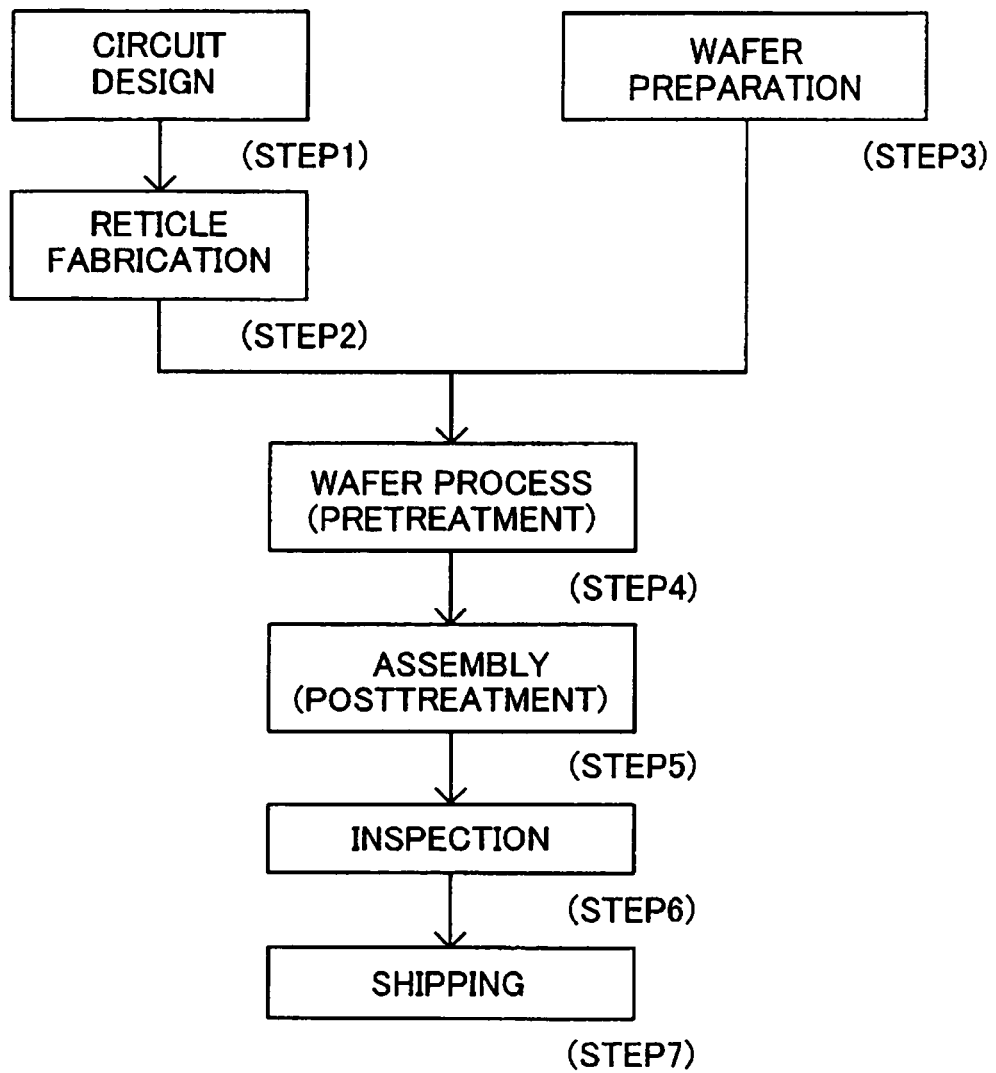
FIG. 7 is a flowchart for explaining a fabrication of devices (e.g., semiconductor chips, such as ICs, LSIs, and the like, LCDs, CCDs, etc.).

Next, referring to FIGS. 7 and 8, a description will be given of an embodiment of a device manufacturing method using the exposure apparatus described above. FIG. 7 is a flowchart for explaining a fabrication of devices (e.g., semiconductor chips, such as ICs and LSIs, LCDs, CCDs, etc.). Here, a description will be given of a fabrication of a semiconductor chip as an example. Step 1 (circuit design) designs a device circuit. Step 2 (reticle fabrication) forms a reticle having a designed circuit pattern. Step 3 (wafer preparation) manufactures a wafer using materials such as silicon. Step 4 (wafer process), which is referred to as a pre-treatment, forms actual circuitry on the wafer through a lithography technique using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 8:
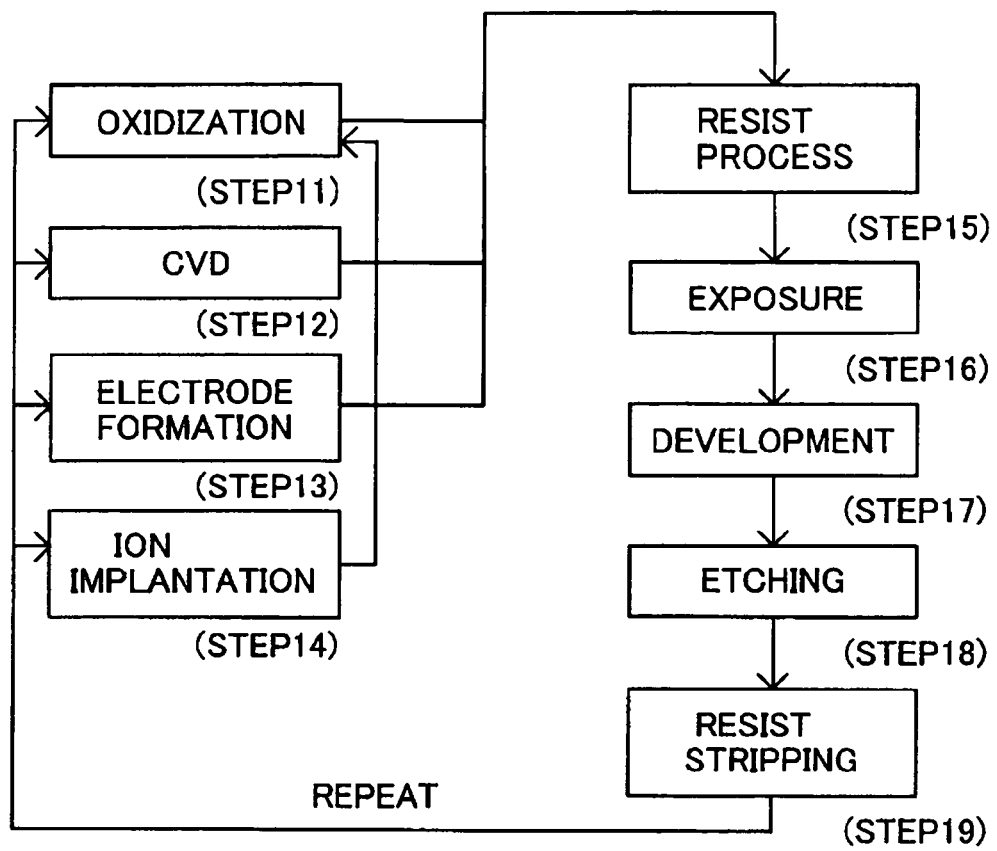
FIG. 8 is a flowchart for a wafer process shown in FIG. 8.

FIG. 8 is a detailed flowchart of the wafer process in Step 4. Step 11 (oxidation) oxidizes the surface of the wafer. Step 12 (CVD) forms an insulating film on the surface of the wafer. Step 13 (electrode formation) forms electrodes on the wafer by vapor disposition, and the like. Step 14 (ion implantation) implants ions into the wafer. Step 15 (resist process) applies a photosensitive material onto the wafer. Step 16 (exposure) uses the exposure apparatus to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated, and multilayer circuit patterns are formed on the wafer. Use of such a device manufacturing method enables higher quality devices to be manufactured than does the prior art. In this manner, the device manufacturing method that uses the exposure apparatus, and the devices as a final product serve as other aspects according to the present invention.

The above embodiments can measure an effective light source distribution without an additional space. These embodiments can be applied to existing exposure apparatuses having no means for accurately measuring effective light distributions. These embodiments calculate a blur of a light that passes a pinhole, and correct it in accordance with the geometrical optics and wave optics, thus providing a measurement of the original light source distribution. Since the illumination light is maintained almost telecentric at the observation position of the image sensor, the incidence sensitivity characteristic on the image sensor is small, and the measurement can be more accurate than ever.

The effective light source distribution of the illumination system acquired from these embodiments can be utilized as an index in adjusting a coherence factor σ and telecentricity obtained from the effective light source distribution. Use of an acquired light intensity distribution for an imaging simulation enables the imaging performance to be evaluated. Actually measured data can be directly used as a light intensity distribution of an illumination system in designing a diffraction optical element.

Further, the present invention is not limited to these preferred embodiments, and various variations and modifications may be made without departing from the scope of the present invention.

What is claimed is:

1. An exposure method comprising the steps of:
   (a) calculating a pupil transmittance distribution in a projection optical system based on a first effective light source distribution of the projection optical system acquired by a measuring apparatus of an exposure apparatus, and a second effective light source distribution derived from a pupil plane light intensity distribution measured on a plate plane using light that has passed the projection optical system without a reticle;
   (b) calculating an imaging performance by using a result of the pupil transmittance distribution calculating step and the first or second effective light source distributions;
   (c) adjusting at least one of the effective light source distribution or the projection optical system by using the imaging performance; and
   (d) exposing the plate based on at least one of the effective light source distribution and the projection optical system that have been adjusted,
   wherein the exposure apparatus includes an illumination optical system that illuminates a reticle using light from a light source, a reticle stage that supports and drives the reticle, a projection optical system that projects a pattern of the reticle onto a plate, and the measuring apparatus for measuring an effective light source distribution as an incident angular distribution of the light on a reticle plane of the reticle,
   wherein the measuring apparatus comprises:
      (i) a relaying optical system configured to guide the light that has passed the illumination optical system; and
      (ii) a housing that contains the relaying optical system and is mounted on the reticle stage in place of the reticle.

2. An exposure method according to claim 1, further comprising the steps of:
   determining whether an illumination condition, with which the illumination optical system illuminates the reticle, has been set or changed; and
   executing said pupil transmittance distribution calculating step, said imaging performance calculating step, and said adjusting step, when said determining step determines that the illumination condition has been set or changed.

3. An exposure method comprising the steps of:
   (a) calculating a pupil transmittance distribution in a projection optical system based on a first effective light source distribution of the projection optical system acquired by a measuring apparatus of an exposure apparatus, and a second effective light source distribution derived from a pupil plane light intensity distribution measured on a plate plane using light that has passed the projection optical system without a reticle;
   (b) calculating an imaging performance by using a result of said calculating step and the first or second effective light source distributions;
   (c) adjusting at least one of the effective light source distribution or the projection optical system by using the imaging performance; and
   (d) exposing the plate based on at least one of the effective light source distribution and the projection optical system that have been adjusted,
   wherein the exposure apparatus includes an illumination optical system that illuminates a reticle by using light from a light source, a projection optical system that projects a pattern of the reticle onto a plate, and the measuring apparatus for measuring an effective light source distribution as an incident angular distribution on a reticle plane of the light,
   wherein the measuring apparatus comprises:
      (i) a pinhole member configured to transmit the light that has passed the illumination optical system into a pinhole with a diameter determined by a blur of geometrical optics and wave optics; and
      (ii) a deflector configured to deflect the light that has passed through the pinhole.

4. An exposure method according to claim 1, further comprising performing the steps of:
   determining whether an illumination condition, with which the illumination optical system illuminates the reticle, has been set or changed; and
   executing said pupil transmittance distribution calculating step, said imaging performance calculating step, and said adjusting step, when said determining step determines that the illumination condition has been set or changed.

5. A device manufacturing method comprising the steps:
   exposing a plate using an exposure apparatus according to claim 1; and
   developing the plate exposed in said exposing step.

* * * * *